United States Patent [19]

Whitehead

[11] 4,097,279

[45] Jun. 27, 1978

[54] PROCESS FOR PREPARING AN IDENTIFICATION CARD

[76] Inventor: Edwin Nelson Whitehead, 6208 Tally Ho La., Alexandria, Va. 22307

[21] Appl. No.: 487,757

[22] Filed: Jul. 11, 1974

Related U.S. Application Data

[63] Continuation-in-part of Ser. No. 431,803, Jan. 8, 1974, abandoned, which is a continuation of Ser. No. 223,649, Feb. 4, 1972, abandoned.

[51] Int. Cl.² .................. G03C 5/04; G03C 11/12
[52] U.S. Cl. ........................... 96/27 R; 96/28; 40/2.2; 156/234; 156/240; 156/277; 427/54; 427/145; 427/146; 427/180; 427/197; 283/7
[58] Field of Search ............ 40/2.2; 283/7; 96/27 R, 96/27 F, 28, 35.1; 161/5; 427/54, 145, 146, 180, 197; 156/234, 240, 277

[56] References Cited

U.S. PATENT DOCUMENTS

| | | | |
|---|---|---|---|
| 3,152,901 | 10/1964 | Johnson | 96/43 |
| 3,158,523 | 11/1964 | Morrow | 156/522 |
| 3,520,758 | 7/1970 | Wiest | 40/2.2 |
| 3,566,521 | 3/1971 | Conner | 40/2.2 |
| 3,582,327 | 1/1971 | Boyd et al. | 96/28 |
| 3,582,439 | 6/1971 | Thomas | 161/5 |
| 3,649,269 | 3/1972 | Kubota | 96/28 |
| 3,655,494 | 4/1972 | Buzzell | 161/5 |
| 3,758,970 | 9/1973 | Annenberg | 40/2.2 |
| 3,821,060 | 6/1974 | Braca et al. | 40/2.2 |
| 3,896,726 | 7/1975 | Staats | 40/2.2 |
| 4,006,050 | 2/1977 | Hurst | 156/234 |

*Primary Examiner*—Edward C. Kimlin
*Attorney, Agent, or Firm*—William D. Hall; Geoffrey R. Myers

[57] ABSTRACT

A process for preparing identification cards which comprises spreading bonding material on a substrate, placing a transparent film over the coated substrate, superposing a photograph having opaque and transparent portions, directing light rays to harden portions of the bonding material which correspond to the transparent parts of the photograph, spreading particulate material over the bonding material, removing the particulate material that has not adhered to the bonding material, and sealing a transparent covering. An identification card comprising a thermoplastic coated magnetic backing means, large number of individual particles arranged to constitute a photographic image bonded to the thermoplastic coated backing means, and a transparent covering overlying the backing and heat sealed thereto. Also provided is a unitary laminated identification card that has a three-dimensional effect which cannot be readily photographically counterfeited and is substantially tamper-proof.

41 Claims, 7 Drawing Figures

PROCESS FOR PREPARING AN IDENTIFICATION CARD

CROSS-REFERENCE TO RELATED APPLICATIONS

This application is a continuation-in-part of my copending application Ser. No. 431,803, filed Jan. 8, 1974, and entitled "Improved Identification Card," now abandoned, which in turn is a streamline continuation of my application Ser. No. 223,649, filed Feb. 4, 1972, and entitled "Improved Identification Card," now abandoned.

BACKGROUND OF THE INVENTION

Due to the high level of industrial competition in this country, many companies have found it necessary to conduct much of their "pioneering" research and development activities under conditions of strict security. Similarly, as has been the case for many years, there are a vast number of governmental agencies which are constantly involved in activities which are conducted under strictest security. Examples of such governmental bodies include the Federal Bureau of Investigation, the Central Intelligence Agency, the Department of Defense, the Department of State, various divisions of the Internal Revenue Service, the National Security Council and many others.

Furthermore, the rapidly increasing volume of international travel has created problems with regard to the detection of persons illegally entering or leaving the country using falsified passports, visas, border crossing cards and alien cards.

In each of the above areas and many others, the proper identification of individuals is critically important. For instance, it is necessary that persons working in high-security jobs be issued identification cards or tags which identify them as individuals permitted to enter the security areas. In order to prevent the unauthorized and potentially dangerous entry of others into these areas it is extremely important that these identification cards be of such a nature that they cannot be counterfeited.

In the field of international travel, the proper identification of persons is equally important. Forged passports and border crossing cards are a common method used today for unauthorized entry into or departure from this country, or, for that matter, any country in the world.

For these and other reasons the development of an identification card that cannot be counterfeited or successfully altered is of prime importance to both private industry and governmental agencies all over the world.

Heretofore a great many identification cards and badges or tags for individuals in these areas have been composed of a conventional paper photograph glued, or otherwise mounted, on a paper base bearing, for instance, the name of the employer and employee and any necessary descriptive information concerning the employee, which photograph and paper base are heat sealed between sheets of a suitable thermoplastic material, such as vinyl, chloride/acetate, copolymer or cellulose/acetate. A significant shortcoming of this type of identification card is its susceptibility to alteration so as to carry the photograph of an unauthorized person. Such an alteration is easily accomplished by cutting around the edge of the original paper photograph through the plastic sheet material to remove the photograph, inserting a photograph of the same size in the space originally occupied by the original photograph, covering the substituted photograph with removed plastic, and gluing or re-laminating the same in position in the badge. This has been so skillfully accomplished that ready detection of the substitution by guards examining the card is not possible.

In an effort to develop cards which are less susceptible to such tampering, some work has been done with the use of magnetic tapes or coatings laminated on the surface of the identification cards. Such magnetic tapes would be provided with a particular code sequence for each individual, which code sequence can easily be effectively altered or counterfeited. Obviously this type of card is of little security value. Exemplary of such an effort is the identification card disclosed in U.S. Pat. No. 3,221,304 owned by a Japanese company. The cost of the suitable reading equipment and its availability at all points of use is, however, prohibitive of the large scale use of such cards. Another shortcoming of these cards lies in the fact that the magnetic flux of these cards is such that they are relatively easily susceptible to accidental destruction of the code by a significant nearby magnetic field. A further shortcoming of these efforts is that while the cards may provide for electronic coded information, the photographic portion of these identification cards so constructed may still be subject to tampering by substitution of photographs.

Despite the developments of electronic coding processes, there appears to be no more effective way to identify authorized users of such an identification card than by providing, at least in conjunction with such an electronic coding method, an identification card bearing a photographic record, which card is constructed in such a manner that there is no effective way to photographically counterfeit the card or to replace the original photograph with an unauthorized photograph. Such a card may be placed in a device which reproduces the photograph on one-half of a closed circuit TV screen while a TV camera simultaneously projects the face of the bearer of the card on the other half of the screen so that the Immigration Inspector or Security Guard can compare the two images side by side and quickly determine, visually, if there has been an alteration.

My own efforts in the field of identification cards have led to the development of cards which were less susceptible to counterfeiting or alteration than the prior art cards. These efforts culminated in a number of patents issued to me including U.S. Pat. Nos. 2,588,067, 2,780,015, and 2,835,993. While these earlier patents disclose methods for preparing identification cards which are, to a large degree, tamper-proof, I have discovered that by way of the present invention, an identification card can be made which is of such a nature that it is even less susceptible than the cards of my earlier patents to counterfeiting and/or alteration.

OBJECTS OF THE INVENTION

It is an object of the present invention to provide an identification card which is more difficult to counterfeit or alter than the cards of the prior art. It is another object of the present invention to provide a novel method for preparing identification cards.

It is another object of the invention to achieve the aforesaid objects in a low-cost and practical manner.

It is still another object of the present invention to provide a laminated identification card and process for preparing thereof in which the photographic record is constructed of such material as to become an integral part of the laminate and thus resist removal of same from the laminated card.

It is a further object of the present invention to provide a laminated identification card, which facilitates automatic identification of the card by established selected magnetic field conditions therein by using a core of metal which has high magnetic retention such as a cobalt-vanadium-iron alloy.

Other objects and advantages of the present invention will become apparent from the specifications and the claims below.

SUMMARY OF THE INVENTION

The process of the present invention comprises:
(a) spreading bonding material on a substrate;
(b) placing a transparent protective film over the coated substrate;
(c) superposing on the transparent protective film a photograph having an opaque portion and a transparent portion (a photographic positive);
(d) directing light rays through the photograph to harden the portions of the bonding material which correspond to those parts of the photograph that are transparent;
(e) spreading particulate material over the bonding material so that the particles stick to the unhardened portion of the bonding material;
(f) removing particulate material that has not adhered to the bonding material;
(g) lamination of the particles stuck to the bonding material to a thermoplastic coated magnetic metal core by a spring-loaded dual hot roller process;
(h) an identification card comprising a white vinyl thermoplastic coated core of magnetic cobalt-vanadium-iron alloy on which there is a throughly adhered, reliable heat-sealable backing means, a large number of individual particles arranged in a formation that constitutes a photographic image (said particles being, for example, carbon black, radio active isotopes or rare earth materials mixed with infrared emitting phosphors), which particles are bonded to a limited part of one surface of the backing means (core 10) and heat-sealable transparent covering overlaying the backing and heat-sealed thereto, forming an integral casing surrounding the photographic image thereby making it alterproof;
(i) heat sealing thereon a transparent thermoplastic covering; and
(j) the same procedure as above except the vinyl coated metal core has low or negative magnetic retention.

The present invention also relates to an identification document comprising a photographic record having an image on one surface thereof, a transparent covering around the photographic image, and means within the transparent covering to produce a three-dimensional visual effect. This effect is made possible by two sets of intricate designs or patterns one, printed on each side of the transparent covering, the same being separated by the thickness of the covering (0.005 inch), which coact with each other to produce a particular three-dimensional design when viewed perpendicular to the cover. The process of matching the coacting design within every document with a similar design fixed permanently in a "reading device" is known as holography. The concept of a holographic spatial filter to verify two like designs at different locations was an original idea of Earnst Abbe in 1886. However, it has been only since the 1960's when lasers were developed with their bright light and straight beams that halography has become widely used. At the present time, using our invention of dual printing and three-dimensional effect, it is a very effective means to prevent counterfeiting.

DESCRIPTION OF PREFERRED EMBODIMENTS

Figure 1:
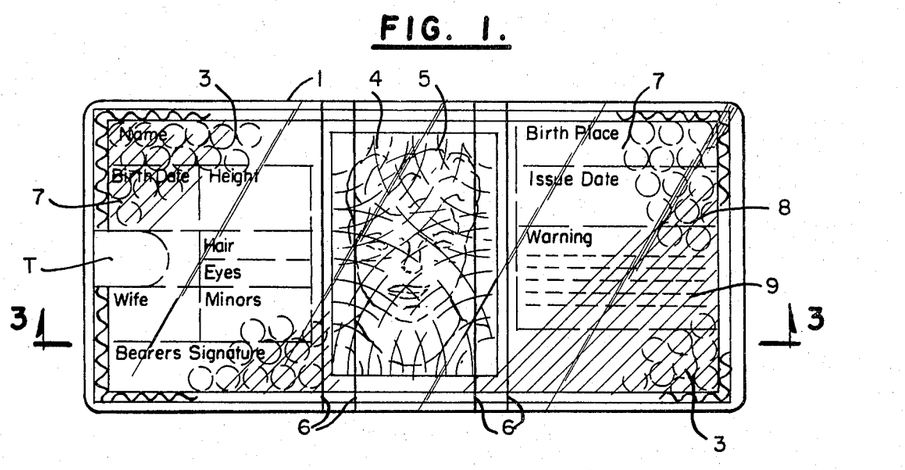
FIG. 1 is a top view of a completed passport identification card embodying a preferred form of the present invention.
Figure 2:
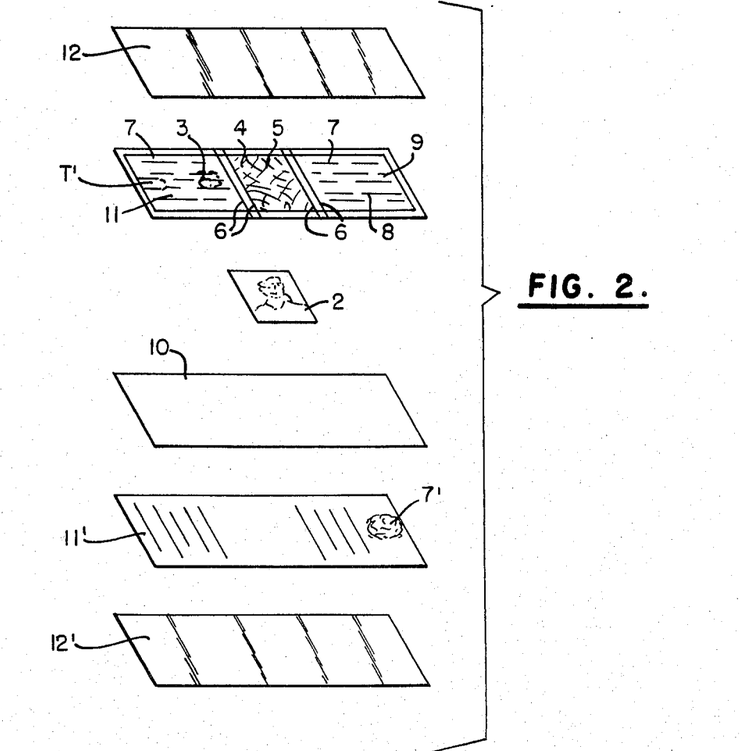
FIG. 2 is an illustration of the manner in which the various transparent thermoplastic sheets of the card of FIG. 1 are positioned with respect to the "photographic record" and the core.
Figure 3:
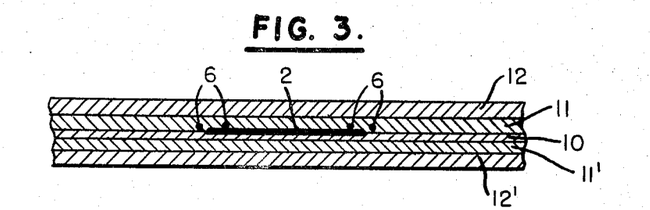
FIG. 3 is an enlarged cross-sectional view, taken along line 3—3 of FIG. 1, of the central portion of the completed card.

Referring to FIGS. 1, 2, 3, there is illustrated a passport identification card 1 embodying the teachings of the present invention. The core 10, which can be white vinyl coated magnetic steel, like the cobalt-vanadium-iron alloy called Vicalloy, has a "photographic record" 2 bearing an image or other desired record placed thereon in contact with and overlying the central portion of the core. Overlying the upper surface of the core 10 and the "photographic record" 2 is a transparent thermoplastic sheet 11 which bears a design marking and/or desired printed information. Sheet 11 bears, on the underside thereof a number of different design markings 3, 4, 5, each bearing preferably of a different color. The printing 8, 9, on the upper surface of this same sheet must be in perfect register with the printing on the underside of the sheet when observed through the transparent thermoplastic sheet. That is the printing would be made up of two sets of lines, part on the upper surface of Sheet 11 (8 or 9) and part on the under side of Sheet 11 (3, 4 or 5) making a complete third dimensional pattern when viewed through the transparent sheet.

The material used for forming the colored or multicolored marking designs 3, 4, 5, on the underside and designs 8, 9, on the upper surface of the transparent thermoplastic sheet 11 is one which has preferably a vinyl resin base for the ink pigments which is the same resin from which the transparent sheets are formed. These special inks are lithographed with high etched engraving plates and run through the lithographic press without the use of water in the fountain. The inks should have the characteristics of having a slightly lower softening point than the vinyl thermoplastic sheet 11 so that when heat and pressure of lamination are applied the inks will run and very slightly bleed together resulting in an entirely different appearing contrast or tone than the original colors. This low softening point makes the ink printed on the underside of the thermoplastic sheet 11 flow easily into the white vinyl coating on the metal core 10.

Once thermoplastic sheets 12, 11, and 11', 12' are placed on each side of 10, forming what might be called a sandwich, the entire assembly is placed in a flat platen type of oil hydraulic press where suitable heat and pressure are applied to produce the unitary identification card 1 of my present invention. The preferred lamination process is to raise the pressure of the oil hydraulic ram to about 750–1000 psi against the sandwich at which time the electric heating elements within the platens are turned on, thereby quickly raising the temperature of the platen, and the sandwich therebetween, to about 320° F to 340° F. Just as soon as this temperature is reached, as indicated by a visual thermometer, the electric power is shut-off automatically and the thermoplastic, which is then in a sticky or molten state, is quickly cooled by a cold liquid (at zero temperature) which is automatically pumped through the platens under 150 psi. The thermoplastic sheet 11 while in the molten state and under high pressure thoroughly flows and mixes with the counterpart sheet 12 and the vinyl coating on core 10.

The design markings 4 and 5 are so positioned on sheet 11 that they overlie the "photographic record" 2. In this embodiment, a blank portion T' is provided in sheet 11 to allow the incorporation into the card of a thumbprint of the user of the card and to provide the clear visibility of the thumbprint through the thermoplastic sheets.

It is most advantageous to place the fingerprint on the underside of the sheet 11 so that the print is adajcent the upper surface of the core 10. Accordingly, it is possible to have the Finger print ink flow into the coating of the upper surface of the core, when present, during lamination as will be discussed hereinafter. Moreover, when the sheet is put into position for lamination, the fingerprint image is twisted 180° as viewed through the front side of the card. This makes it extremely difficult to replace the fingerprint. In addition, it may be desirable to place an intricate overlay design on the sheet over the fingerprint area with invisible ink which only becomes visible when exposed to ultraviolet light for further protection against alteration.

Gold threads 6 are provided on the underside of sheet 11 so as to be in direct contact with the "photographic record" 2. Also illustrated in this embodiment is the incorporation of an additional protective transparent thermoplastic sheet 12 which is used to protect any printed or typed matter that may be on the upper surface of sheet 11. In addition to the protective nature of this additional sheet 12, it also eliminates the possibility of alteration of such matter. It is preferable that there be positioned the same number of thermoplastic sheets, of the same thickness, on each side of the core 10 to prevent curling.

As illustrated in the drawings, there is provided transparent thermoplastic sheet 11' on the opposite side of core 10, bearing identification information and/or design markings on the undersides thereof (the surface nearest the core 10). Sheet 11', as illustrated herein, bears appropriate passport information 7' (such as the seal of the issuing department of government, passport number, and authorization for travel, etc.).

There is provided also on this opposite surface of the core 10 an outermost protective thermoplastic sheet 12'.

These various sheets when laminated together under heat and pressure provide a unitary identification card comprising a "photographic record" encased in a transparent material, having the outward three-dimensional appearance shown in FIG. 1, although the third-dimensional effect cannot be adequately depicted in the drawing.

Figure 4:
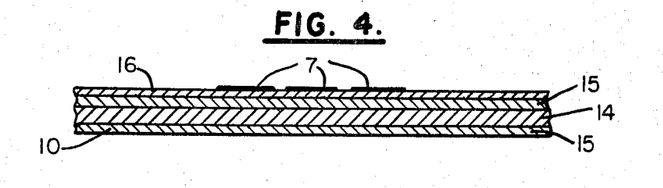
FIG. 4 is a cross-sectional edge view of a vinyl coated core wherein the "photographic record" is formed directly on the coating.

FIG. 4 illustrates a core 10 for use in accordance with the present invention. As illustrated core 10 is comprised of a main sheet metal material 14 which is coated on both sides with an opaque white thermoplastic material 15 which has been made fully compatible with the sheet metal by treating the surface of the sheet metal with an iron phosphate solution prior to the coating procedure as described further along in this presentation. The white vinyl coating provides the appropriate background and improved adhesion of the coated core 10 and the other thermoplastic layers of the card. The upper surface of the coated core 10 is then coated with a uniformed layer of an ultraviolet sensive prepolymer 16 and a transparent protective film (not shown) is placed thereover. A transparent photographic positive (not shown) provided with half-tone dots is placed over the coated core 10 and the prepolymer surface is exposed to ultraviolet light. That portion of coating 16 not protected by the positive photographic film hardens while the protected portion remains tacky. The transparent protective film is stripped off and carbon black or other suitable pigments are sprinkled over the prepolymer coating and adhere to the tacky unexposed portion while as much as possible of the excess carbon black, or other pigment, is brushed away. The adhered pigment forms the image of the "photographic record" 17 as an integral portion of the coated core 10.

The pigment can partially include mildly radioactive isotopes such as Promethiene-147 and/or rare earth metals or compounds thereof which are naturally radioactive such as thorium and thorium oxide, so that a reading device such as a Geiger measuring unit can determine if the photograph has been altered or if the laminated card is a counterfeit. The radioactive materials can be admixed with carbon blacks if desired. If desired the pigment, partially or entirely, can be rare earth materials mixed with infrared phosphorus material, or a mixture thereof, or carbon black or other types of rare earths materials.

The term "prepolymer" as used throughout the specification is intended to define those bonding materials which upon exposure to ultraviolet light lose their adhesive characteristic since many of those polymers which can be employed will increase in molecular weight when exposed to ultraviolet light. The term "prepolymer"; however, does not necessarily mean that the entire coating increases in molecular weight nor does it actually indicate that it is necessary for the portion exposed to the ultraviolet light to actually increase in molecular weight, as long as the tacky nature of that portion is destroyed.

As stated previously, one aspect of the present invention comprises a "photographic record" encased within a thermoplastic material, which thermoplastic material is provided with a number of design markings therein so as to produce a unitary identification card having a three-dimensional effect which is extremely difficult to photographically counterfeit or physically alter. It is to be understood that the present invention can be practiced without providing a three-dimensional effect. Various preferred aspects of the present invention are therefore set forth below.

Figure 5:
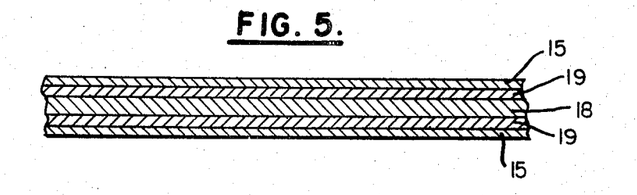
FIG. 5 is a cross-sectional edge view of a thermoplastic coated core wherein the metal center section 18 is electroplated with a metal like iron prior to a thermoplastic coating. Subsequently the iron plating is processed chemically to promote full adherence to the thermoplastic coating and the "photographic record" formed directly on the thermoplastic coating.

FIG. 5 illustrates a core for use in accordance with the present invention. As illustrated the core comprises a main sheet of cobalt-vanadium-iron alloy material 18 which has been electroplated with iron 19 and treated with an iron phosphate solution, as described further along in these specifications, prior to thermoplastic coating. After this process of iron electroplating the cobalt-vanadium-iron metal sheet 18 is handled exactly like 14 in FIG. 4.

I. THE CORE

As has been stated, the unitary identification card 1 comprises a "photographic record" 2 encased in a transparent material. The most economical method of encasing the "photographic record" is by way of laminating it between transparent thermoplastic material such as sheets 12 and 11 and 11' and 12'.

It is preferable that the "photographic record" 2 be supported on a core 10. The unitary card 1 and correspondingly the core 10 may be of any desired shape. The core 10 can be formed from any of many suitable materials, for example (a) a thin rigid sheet of metal, which can be magnetic, or (b) an opaque thermoplastic sheet that is relatively thick as compared to the thermoplastic sheets placed over it.

Core 10 should preferably be a material that has surface properties such that it can be uniformly joined by lamination with the thermoplastic sheet materials, and will provide a contrasting background for the desired typed identification information (7 and 7') and for the design markings 3, 4, 5, and 8, 9. The core 10 should preferably be between about two and two and a half thousandths of an inch thick and also preferably have a vinyl thermoplastic coating which is opaque white, or another appropriately light color, so as to provide both the compatibility with the overlying thermoplastic sheets and the desired contrasting background. This vinyl thermoplastic coating on the core (illustrated in FIG. 4 by numeral 15) should preferably be on both sides of the sheet metal 14 and applied after the sheet metal has been treated with an iron phosphate chemical bath, as described in detail further along in these specifications. The coating should preferably be of a thickness of no more than five ten-thousandths of an inch and most preferably about 0.00025 of an inch on each side as to provide a coated core of a total thickness of 0.0005 inch.

A suitable thermoplastic vinyl copolymer for the coating on the core is commercially available under the trade designation "VMCH" from Union Carbide Corporation which according to the manufacturer contains about 86% by weight of vinyl chloride, about 13% by weight of vinyl acetate, and about 1% by weight of maleic acid. Other suitable vinyl copolymers include those formed by the copolymerization of vinyl halides such as vinyl chloride or vinyl bromide with aliphatic, alpha, beta-olefinic carboxylic acids, or by the copolymerization of vinyl halides, vinyl esters of lower fatty acids of about 1 to 6 carbon atoms such as acetic, propionic and butyric acids; and the aliphatic alpha, beta-olefinic carboxylic acids.

The aliphatic, alpha, beta-olefinic carboxylic acids contains the group and the term "acids" also includes the anhydrides of the acids. The acids may be monobasic or polybasic and may contain one or more olefinic groups in addition to the one which is in a conjugated position with the moiety. Illustrative of some suitable acids are maleic acid, fumaric acid, mono-esters of fumaric and maleic acids, maleic anhydride, acrylic acid, amethacrylic acid, crotonic acid, citaconic acid and its anhydride, itaconic acid and its anhydride, chlormaleic acid and the like. Exemplary of some monoesters of maleic and fumaric acids are monomethyl fumarate and mono-2-ethylhexyl maleate. The copolymers generally contain between about 0.5% and 20% by weight and preferably between about 0.5% and 10% by weight of combined carboxylic acid. When vinyl esters are present in the copolymer, in addition to the vinyl halide and carboxylic acid, their amount may vary from about 3.2% to about 40% by weight and preferably from about 5 to about 20% by weight. For a further discussion of suitable vinyl polymers for use in the coating on the core, see U.S. Pat. No. 2,411,590 to Powell. These polymers may also contain stabilizers which prevent or retard deterioration of the polymder due to ultraviolet light.

It is possible, however, that a thermoplastic material may be used to form the core 10 which is inherently of an opaque white color, thus eliminating the need for the opaque vinyl coating. When a thermoplastic sheet is used as the Core 10, it is preferably composed of the same thermoplastic material as the subsequent laminations described below.

II. CORE OF COBALT-VANADIUM-IRON MAGNETIC ALLOY

It is preferable, in order to increase the counterfeit-proof nature of the identification card of the present invention, that the card be magnetically coded at selected locations in accordance with a predetermined identification code. This can be done basically in two ways. For example, the sheet metal 18 (see FIG. 5) may be formed of sheets of readily magnetizable metal. One such metal is an alloy of cobalt-vanadium-iron commercially available from Allegheny-Ludlum Steel Corporation, the Carpenter Steel Corporation and Hamilton Technology Corporation under the trade name of Vicalloy. Another way that this can be accomplished is to form the core 10 from one or more thermoplastic sheets therebetween a magnetizable coating such as iron oxide or material containing rare earth metals and cobalt. The rare earth metals praseodymium (Pr); samarium (Sm); lanthanum (La) and cerium (Ce) are precisely alloyed with five atoms of cobalt creating a new family of permanent magnetic materials. These compounds, $LaCo_5$, $CeCo_5$, $PrCo_5$ and $SmCo_5$, are now commercially available on the open market from the Molybdenium Corporation of America. When such a magnetizable coating is to be used, the core may be formed by placing an iron oxide, or the above rare earth cobalt alloys, in layers preferably one thousandth of an inch, or less, on one face of one of the thermoplastic sheets which are then cemented or otherwise adhered together with iron oxide or rare earth cobalt alloy in between the two sheets.

The iron oxide, or rare earth cobalt alloys, can also be applied to one surface of the completed unitary laminated card 1, which card is readable according to the teachings of U.S. Pat. No. 3,221,304. This type of coating will be desirable only where there is no information placed on the back of the card 1 (the surface opposite the photographic record) due to the fact that the coating is not transparent.

A preferred metal for the core is the aforementioned cobalt-vanadium-iron alloy same 0.002 inch to 0.0025 inch thick, sold under the trade designation as Vicalloy which, according to manufacturers, contains approximately 52% by weight of cobalt, 38% by weight of iron and 10% by weight of vanadium. Other suitable cobalt-iron alloys contain about 36 to 62% by weight of cobalt, about 30 to 52% by weight of iron and about 6 to 16% of vanadium. For further discussion of such metals please see U.s. Pat. No. 2,190,667 to Kelsall et al. Moreover, suitable magnetic cobalt-iron alloys can contain up to about 16% of alloying materials such as vanadium, carbon, manganese, silicon, chromium, molybdenum, tungsten, praseodymium, samarium, lanthanum, cerium or mischmetal, and mixtures thereof. These alloying materials improve the magnetic characteristics of the cobalt-iron alloy and in some cases greatly help the manufacture of thin sheets. When the alloy finished product is in sheet form, vanadium and/or molybdenum is most likely used in combination with samarium and/or mischmetal to improve the magnetic characteristics. The most preferred alloy contains about 55 to 60% cobalt, about 25 to 30% iron, about 5 to 8% mischmetal or samarium and 10 to 15% vanadium.

The main advantage of the cobalt-vanadium-iron alloys is the finished identification card can be made relatively flexible and thin and still have the magnetic features of much thicker metals such as high carbon heat treated stainless steel.

Because of the hexagonal crystaline molecular structure of cobalt-iron-vanadium and other magnetic alloys, the very feature which makes these alloys such fine magnetic materials, makes it very difficult if not impossible to obtain satisfactory adhesion between the alloys and a thermoplastic coating. This results in frequent separation of the metal core and the thermoplastic layers during use (a sort of delamination). Such separation of a laminated security document obviously makes same of little value. Therefore, in order to provide full and reliable adhesion between such cobalt-iron, and other magnetic alloys, and the coating of thermoplastic material indicated by 15 and/or the copolymer used in our photographic process, it is necessary to electroplate the surface of the alloys with a metallic substance which can be chemically treated to obtain maximum compatibility between the plated surface and the vinyl thermoplastic coating. Such chemical treatments have no effect whatsoever on magnetic alloys if they are not electroplated with another metal which can be made compatible. These metallic substances include iron, zinc, brass or copper and the like. Such metal, of course, must not be cobalt. During the electroplating process both surfaces of the cobalt-iron or other magnetic alloys are covered with a thin (0.0001 inch to 0.0002 inch) layer of the above described metallic substances which then can be chemically treated prior to a thermoplastic coating.

This process is a very effective method to obtain a thin layer of compatible metallic material, such as pure iron, on both sides of the magnetic alloys. The most effective and efficient method to accomplish the above is a Ferrous Chloride electroplating system as described below. Basically the system is a Ferrous Chloride-Calcium Chloride solution consisting of 40–60 oz/gal of Ferrous Chloride and a 20–25 oz/gal Calcium Chloride in a plating tank the temperature of which should be 190° F minimum. The current density with no agitation should be approximately 70–80 amps/sq. ft. If there is to be agitation the current density should be approximately 200 amps/sq. ft. Of course, the anode must be pure iron. The pH to begin with should be 1.2/1.8; however, this should be lowered, as the plating process begins, to approximately 0.50/0.60 pH. This can be accomplished by adding commercial muriatic acid. Degreased steel wool should be added to the tank to reduce the ferric ion and activated carbon to remove harmful impurities. The solution is filtered into the plating tank by means of a siliceous filter aid. The above system guarantees high permissible current densities for fast plating, high conductivity and a strong, ductile, smooth deposit of pure iron.

It is most practical to perform the electroplating in continuous form. In other words feed the magnetic alloy into the plating tank from a coil and when the alloy is plated on both sides, feed same out of the tank for a thorough rinse to remove the plating chemicals from the surface. There should be two separate rinse steps, the first a room temperature spray at 10/15 psi and the second a high temperature spray at 10/15 psi of pure water at 150° F/160° F.

To continue the continuous form technique it is advisable to pass the alloy, after it has been thoroughly cleaned of the plating chemicals, into an inclosure where a 8.0%/9.0% solution or iron phosphate and 1.0% to 1.5% of caustic soda solution, with a pH of 4.5/5.5 is sprayed under 10/20 psi against both sides of the alloy for 30 to 60 seconds. This solution of iron phosphate should be heated to 160° F/170° F. Thereafter, the alloy should be spray rinsed with water 5 to 10 seconds at 60° F/75° F at 15 psi. The next step is a 0.1% to 0.15% chromic phosphoric acidulated spray rinse with a pH of 4.0/5.0, heated to 120° F/140° F, at a pressure of 15/20 psi for 5/10 seconds. Hot air is then applied to thoroughly dry the chemically prepared iron plated alloy now ready to be coated with a thin thermoplastic film 15 of approximately 0.00025 inch on each side. If possible, the thermoplastic coating 15 should be applied within 24 hours after electroplating and the iron phosphate treatment, and certainly not longer than three days; otherwise, there will be an oxidation of the iron plating. In the event it is not possible to apply the iron phosphate treatment immediately after electroplating it will be necessary to treat the surfaces of the iron plating (both sides of the alloy) with a strong alkaline cleaner like calcium hydroxide $(Ca(OH)_2)$ sodium hydroxide (NaOH) potassium hydroxide (KOH) to remove oxidation and impurities which begin to gather rather quickly after electroplating. The alkaline chemicals should be thoroughly rinsed away as described above prior to a subsequent iron phosphate treatment.

If it is decided to electroplate with zinc instead of iron the chemical used to prepare the alloy for thermoplastic coating should be zinc phosphate or zinc chromate. Of course, if it is advisable to use a metal for 14 which is not the highly magnetic alloy there is no need to electroplate with iron, zinc, etc., since the iron phosphate treatment can be directly on the iron-sheet metal to thereby guarantee a perfect bond between 14 and 15. However, if the metal core used is one with high magnetic retention, such as cobalt-iron-vanadium, or other similar magnetic alloys, electroplating is required. The very fact that a metal has high magnetic retention means that it does not best lend itself to vinyl coating without electroplating.

It may be desirable that the completed card of the present invention be capable of being embossed, like conventional credit cards, with the name of the user and other pertinent information. It has been found that the card may be embossed with relative simplicity when the core 10 is a thermoplastic sheet material. Where the core 10 is formed from a readily magnetizable iron-cobalt sheet metal, it has been found that the sheet metal is drawn thin enough so that the card 1 can accept embossing without damage to the card or the embossing equipment. It has been found that the card can be easily embossed when the sheet metal forming the core 10 is of a thickness of about one-thousandth of an inch.

III. THE "PHOTOGRAPHIC RECORD"

The "photographic record" is placed or formed on a portion of one surface of the core 10 preferably in a contacting relationship with same. However, it is within the scope of the present invention to have a sheet of material between the "photographic record" 2 and the core 10 without departing from the concept of the present invention. For example, the "photographic record" 2 in FIG. 2 might be positioned between transparent sheets 11.

The type of "photographic record" 2 used can vary, with certain embodiments being more preferable than others. There are two highly successful methods of applying the "photographic record" 2 to the core 10 in such a manner as to produce a unitary card 1 from which the "photographic record" 2 cannot be removed.

These methods comprise spreading the bonding material on a substrate, placing a transparent protective film over the coated substrate, superposing a photograph having an opaque portion and a transparent portion, in adjacent parallel relation to said protective film and bonding material, directing light rays through the photograph to harden the portions of the bonding material which correspond to those parts of the photograph that are transparent, spreading particulate material which may, if desired, be mildly radioactive or infrared light emitting phosphors over said bonding material so that particles stick to the unhardened portion of the bonding material, and removing the particulate material that has not adhered to the bonding material.

The first of these methods comprises coating a very thin thermoplastic (i.e., vinyl) opaque white film such as the films discussed above which can be coated on the steel cores, with any prepolymer material that is readily sensitive to ultraviolet light (for example, a material that hardens upon exposure to the light). Most conventionally produced prepolymers are sensitive to ultraviolet light, and there have been many efforts to overcome this "inherent" sensitivity. The present invention offers a use for such light sensitive prepolymers which do not have to be so modified. Preferably the prepolymer is a vinyl polymer such as a polymer of vinyl chloride. Some examples of prepolymers sensitive to ultraviolet light can be found in U.S. Pat. No. 3,060,024 to Metuchen, et al.

Once the opaque white vinyl film is coated with this prepolymer, which coating is tacky, there is placed over the coated vinyl film a thin, preferably five ten-thousandths of an inch, transparent film to protect the tacky coating. Such a film suitable for use as the protective cover is the clear film polyethylene terephthalate sold under the trade designation "Mylar." Placed over this protective film is a transparent photographic positive produced according to known photographic processes. The coated vinyl film is then exposed to an ultraviolet light source for a suitable period of time. The positive and protective film are removed. That portion of the film coating not covered by the positive is hardened by the light while the remainder of the coating is unhardened and remains tacky and adhered to the vinyl film. A finely powdered carbon black or other suitable pigment, which may be radioactive if desired or an infrared phosphors blend, is sprinkled over the coated film. When brushed away the pigment has adhered to the tacky portion of the coating to reproduce an effective photographic reproduction of the image. The brushing away of the unused pigment has to be carefully done so as to not stain the white vinyl coating on the core. The photographic reproduction of the image of the present invention makes the photograph alter-proof since it becomes, upon lamination, an integral part of the other thermoplastic laminations 12, 11 and 11', 12', and especially the core 10, and is thus not easily subject to alteration. This is true becase this "photographic record" 2 comprising the pigmented image is compatible with and actually flows into the thermoplastic coating on the core 10 and the subsequent thermoplastic laminations.

The second method comprises forming the image of the "photographic record" 2 directly on the core 10. The image of the "photographic record" can be formed directly on the core 10 in one of two ways. First, the image can be prepared by directly coating the core 10 with the ultraviolet light sensitive prepolymer (i.e., designated 16 in FIG. 4), covering same with a protective film and treating it in accordance with the steps set forth in the preceding paragraph. By so contacting the photographic record with the core 10 there results a combination, illustrated in FIG. 4, of a core 10 bearing an image 17, which combination is of an essentially uniform thickness. This eliminates the need for the "partial laminate" which would result from the use of the separate "photographic record," as is illustrated in FIGS. 1–3 by numeral 2, overlying a portion of the core 10.

Another method of forming the image directly on the core 10 involves the coating of any suitable substrate with an ultraviolet light sensitive prepolymer and placing a transparent protective film over the coated substrate as discussed above. A transparent photographic positive is then superimposed on the protective film and the coated substrate is then exposed to an ultraviolet light source for a sufficient period of time whereby the coating is hardened except for that portion of the coating underlying the photographic positive, which portion remains tacky. The photograpic positive and the protective film are removed. The coated substrate is then placed in contact with the core 10 in such a manner that the coating of the prepolymer is directly contacting the core. When the coated substrate is thereafter removed from the core 10, the tacky image-portion of the coating remains adhered to the core. Carbon black or other suitable pigment is then deposited on the core bearing the tacky image-portion of the prepolymer coating and treated as described previously to produce the image of the "photographic record" 2.

The preferred method of forming the image of the "photographic record" directly on the core 10 follows essentially the same procedure as in the preceding paragraph with the following change in procedure. The carbon black or other suitable pigment is spread over the tacky portion of the coated substrate after the substrate and the photographic positive have been exposed to ultraviolet light and the positive and protective film have been removed. This produces the image. Having thus produced the image, the coated substrate bearing the tacky image is then placed in contact with the core 10 in such a manner that the coating of the prepolymer is directly contacting the core. The coated substrate is subsequently removed leaving behind the tacky black or other colored image adhered to the core.

Figure 6:
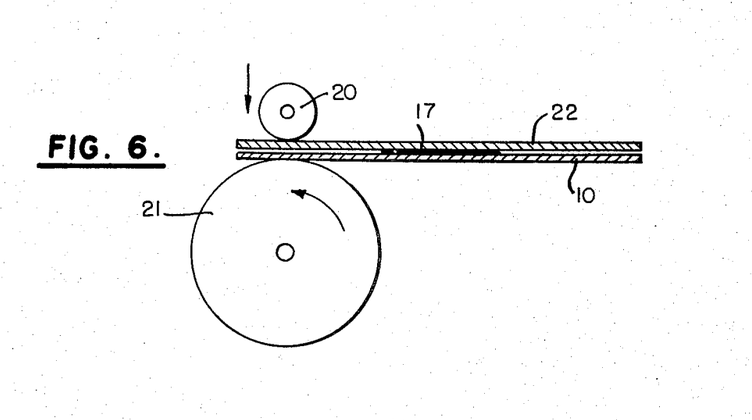
FIG. 6 illustrates a method of transferring an image to the metal core.

As shown in FIG. 6, a preferred manner in which the tacky image is placed in contact with the core 10, so as to have the tacky image adhere to the core, is to pass the core 10 and the substrate 22, bearing the pigmented image 2, through a set of rollers. The top roller 20 is spring loaded and is of hard rubber. The bottom roller 21 is a hard aluminum roller with an electrical heating element cast therein and is coated with a layer of teflon to prevent sticking. The aluminum roller is heated by adjustment to between 225° F and 240° F and the applied pressure is about 100 to 125 psi. After the core and substrate containing the tacky portion are passed through the rollers whereby they are exposed to a temperature of between 225° F and 240° F from the aluminum roller, the tacky image adheres to the core. The elevated temperature also renders the coating on the metal core partly tacky, thereby promoting full adherence with the tacky image. Next the substrate is removed leaving behind the image on the core.

This "transfer process" is preferred because the prepolymer coating is deposited only on a relatively small portion of the core 10. This coating method involves fewer technical problems and provides for better lamination between the core 10 and the subsequently applied thermoplastic sheets 11 and 11' discussed below.

Figure 7:
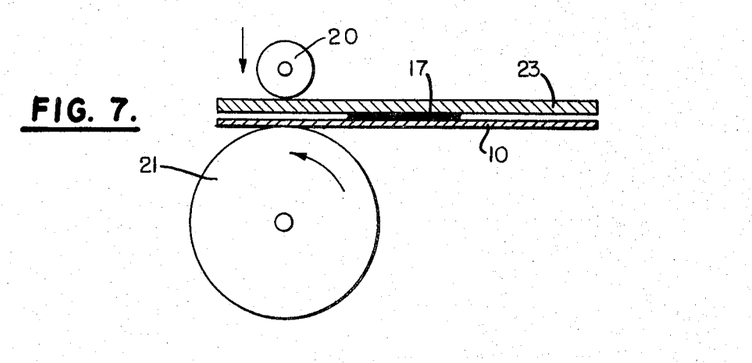
FIG. 7 illustrates the lamination and fusing together of a photographic image and the thermoplastic coating on the metal core.

As shown in FIG. 7, in order to insure that the photographic image, which is deposited upon the core 10 by any of the various suitable means, becomes a permanent part of the core 10, it is preferred to pass the thermoplastic coated core 10 containing the image through a set of rollers of the type shown in FIG. 6 except that the temperature of the aluminum roller should be adjusted to about the softening point of the thermoplastic coating on core 10, which is approximately 275° F to 300° F. the pressure of the spring loaded roller 20 against aluminum roller 21 should be approximately 125 to 140 psi.

One convenient way to increase the pressure of the rollers is to place a thick sheet of heat resistant silicon rubber 23 (0.125 inch thick) against the photographic image as the image and core are passed through the rollers as illustrated in FIG. 7. The procedure of using the silicon results in the necessary pressure on all edges to thoroughly fuse together the photographic image and the thermoplastic coating on the core at which time the image actually flows into the coating and becomes an integral part thereof. The silicon rubber easily separates from the core and image after they have completed passage through the rollers.

Several pigmented color images may be used on the card of the present invention by following the above procedure for each of the colors used in forming the multi-colored image. For instance, several photographic positives can be made from corresponding negatives produced by conventional "color separation" techniques. Each positive will be used for exposure as discussed above. After exposure the protective film and the positive are removed and the proper color pigment is dusted or spread over the tacky unexposed portion. This procedure is repeated for each positive with the application of appropriate color pigment until the desired color image is produced on the tacky portion of the prepolymer coating. If it is desired one or more of the pigments making up the colored image can be radioactive or rare earth materials mixed with infrared phosphors material, the use of which has been described as follows.

IV. THE USE OF INFRARED PIGMENTS FOR THE PHOTOGRAPHIC IMAGE, THE LITHOGRAPH INK AND THE PRINTING INK USED FOR THE SERIAL NUMBERS

Rare earth infrared phosphors materials, used as the powdered pigment for the photographic image, the lithograph copy and printed serial numbers, can be specifically blended to emit, radiate or reflect infrared light waves at a definite nanameter wave length and color. A laser beam directed at the photographic image at a predetermined wave length, of say 900 nanameters, will make a spot on the photographic image glow or radiate infrared light waves at that particular wave length of 900 nanameters. Incidentally, this reflection may be invisible to the human eye since the eye cannot detect light waves smaller than 750 to 800 nanameters. The reflected infrared waves will be detected by a silicon photo-diode which has been designed to only recognize such light in the range of 900 nanameters and only such beams of light that have a predetermined diameter of, as small as, 0.50 millimeters. Another type of diode can be used to verify the color of the reflection.

The rare earth infrared phosphors material, the laser beam and the silicon photo-diode all can be "tuned", so to speak, so that they match each other. One part of the system singularly not operating will prevent the examination of the document and sound off a warning signal. The object of this, of course, is to make the photographic image and the document truly counterfeit-proof since if the wrong mixture of pigments are used there will not be the correct reflection of the infrared waves to operate the silicon diode and the warning signal will be sounded. The same thing would happen if someone tried to alter the photograph, the lithograph copy or the serial number, and disturbed the surface of same.

After the card has been laminated it would be impossible to analyze the pigments used in an attempt to determine their nature or formula of the rare earth infrared phosphors blend of material and its reflected wave length. This is because the photographic image, created by the pigment and the inks, flows and mixes with the white vinyl thermoplastic coating 15 on the metal core 10, as well as into the thermoplastic sheets 11 laminated to the core, while the heat and pressure of lamination are applied.

V. THE TRANSPARENT MATERIAL

Having formed the core 10 and "photographic record" 2, there are provided on both surfaces of core 10 preferably bearing said "photographic record" 2, transparent thermoplastic sheets (i.e., sheets 12, 11 and 11', 12') in a predetermined relationship. These thermoplastic sheets can be formed from any suitable transparent thermoplastic material but are preferably formed from a polymer of vinyl acetate or cellulose acetate or a copolymer of a vinyl acetate and a vinyl chloride.

In accordance with the present invention, at least one transparent thermoplastic sheet (i.e., 11) is disposed over the surface of the core 10 bearing the "photographic record" 2 (said surface hereinafter referred to as the upper surface of the core). The sheet 11 may be provided with an intricate design marking in perfect register (i.e., markings 3, 4, 5, 8, and 9) on one or both surfaces thereof, if desired. These design markings can be of the same color. Preferably, however, each of the markings, if employed, is a different color; and more preferably, each design marking is formed using a variety of different colors, i.e., a rainbow effect. At least two of these patterns should preferably be of distinctly different designs (i.e., markings 3 and 9), and preferably each marking on the thermoplastic sheets should be of a design different from the others. It is most preferable that the transparent thermoplastic sheet 11 immediately adjacent and contacting the entire surface of the core 10 bearing the "photographic record" 2 bear markings such that the portion of said sheet immediately overlying and contacting said photographic record be of a design and/or color (i.e., markings 4 and 5) different from that portion of the same sheet which is not immediately adjacent and contacting said photographic record (i.e., marking 3).

Also, at least two design markings, preferably differently colored or each multi-colored, should be separated in the laminated card by the thickness of at least one of these transparent thermoplastic sheets (i.e., five-thousandths of an inch). This feature gives the the laminated identification card a three-dimensional effect that is extremely difficult to photographically duplicate by the process of "color separation" as discussed above. The design marking chosen may be any desired design pattern. For example, the marking pattern may be a human or animal likeness, a landscape, etc. Obviously, the more intricate the design marking, the more difficult it will be to reproduce. Along this same line, the more designs and the more colors used, there is correspondingly a lesser likelihood of successful photographic, etc. counterfeiting. This three-dimensional multicolor, perfectly registered multi-design effect, created most economically by laminating the thermoplastic sheet 11, over the "photographic record" 2 and the core 10, also makes it extremely difficult, if not impossible, to successfully remove the original authorized photographic record and replace it with an unauthorized one.

Where it is necessary or desired, the thermoplastic sheet 11 overlying the upper surface of the core 10 may be provided with printed legends and/or identification information. For instance, this may be especially desirable in the preparation of such items as the passport illustrated in the drawings.

Often these thermoplastic sheets are provided with legends, illustrated generally by numeral 7, containing blank spaces for the typed insertion of the name of the traveler and the necessary identification information. When (1) such information is typed in and this typed sheet will be used as the innermost lamination in the instant unitary identification card 1 or (2) there is to be provided a design marking on the outer surface of the intermost lamination 11, it is preferable to include as an additional lamination a second transparent thermoplastic sheet 12 with no design or printing thereon so as to protect the accidental removal or the purposeful alteration of the outermost printed surface during lamination or during subsequent use of the card.

In addition to the transparent thermoplastic sheets overlying the upper surface of said core 10, it is desirable to provide transparent thermoplastic sheets (i.e., sheets 11' and 12') on the opposite surface of the core 10 to prevent curling. These sheets may also be provided with different markings and/or colors as are the transparent thermoplastic sheets overlying the upper surface of said core. As was the case with the sheets overlying the upper surface, should the outermost surface of the outermost sheet overlying the opposite surface of the core be provided with a design marking or identification information, there should be provided thereon, as an additional lamination, a transparent thermoplastic sheet to protect this matter.

While a number of laminations of the transparent thermoplastic sheets may be provided on each surface of the core 10, there is no essential requirement as to the number of such laminations. There are, however, mechanical limitations to be recognized. For instance, the completed unitary identification card 1 should not be unnecessarily thick and cumbersome. The thicker the card, the more difficult it will be to successfully and completely laminate all layers and to successfully emboss if desired. Notwithstanding this, the transparent thermoplastic sheets should be of a sufficient thickness to impart the novel three-dimensional effect, when desired, to the completed unitary identification card 1.

It has been found suitable to use transparent thermoplastic sheets of a thickness of about five-thousandths of an inch and to use preferably no more than two such sheets on either side of said core. It is most preferable that the thickness of transparent thermoplastic material on one surface of the core 10 be equal to the thickness of such material on the opposite side of the core. This equal thickness is best imparted by providing an equal number of thermoplastic sheets on each side of the core 10.

It may also be desirable, as an additional feature to prevent counterfeiting or alteration of the card of the present invention, to provide one or more gold/black colored threads 6 in the instant card wherein these threads 6 are disposed between the upper surface of the core 10 and the first transparent thermoplastic sheet overlying same and preferably overlying the "photographic record" 2.

The threads 6 in the preferred embodiment are formed of plastic threads of black vinyl chloride/vinyl acetate copolymer wrapped with strips of aluminum foil coated with gold acetate to impart gold colored surface characteristics to the foil. Gold is preferred since it is practically impossible to photograph and reproduce the gold color. Since the black vinyl chloride/vinyl acetate copolymer thread is soluble in ketones and esters, the threads will be dissolved in part and will run and streak the core 10 and "photographic record" 2 if any attempt is made to remove the thermoplastic sheets (11 and 12) by dissolving them in a ketone or other solvent. Also, if the laminated thermoplastic sheets 11 and 12 were successfully removed mechanically without marring the appearance of the photograph, any attempt to reseal the unitary identification card by a second lamination process would cause the vinyl chloride/acetate polymer threads 6 which are thermoplastic in nature to melt and flow and produce a readily detectable discoloration or marring of the appearance of the card 1.

If it is so desired, the core, as stated above, can be formed of an opaque white thermoplastic sheet. It is within the scope of the present invention to provide a unitary identification card wherein the core 10 is an opaque sheet and the unique three-dimensional multi-colored and/or multi-design marking effect, when desired, is provided by creating one marking design in the transparent material below the "photographic record" 2 and one marking design above the "photographic record" 2. Such a card could also be provided with any desired identification information 7 as set forth above.

The card is generally characterized by the "photographic record" 2 being encased in a unitary body of transparent material wherein there may be provided at least two different colors or two marking designs which may be essentially the same and of the same or different colors. The marking designs occupy predetermined positions within the transparent material surrounding the "photographic record" 2 so as to provide the unique three-dimensional effect when desired which is extremely difficult to counterfeit or alter.

Other methods of making the unitary identification card of the present invention are within the scope of the present invention. The laminating process has been described in detail because it has been found to be the most economical and the easiest to control in terms of the quality of the card.

The unitary identification card 1 of the present invention, in addition to its utility in the field of tamper-proof and counterfeit-proof identification cards and passports can also find utility in the preparation of credit cards of these same counterfeit-proof and tamper-proof properties. When the core 10 of the present invention is formed of an opaque (i.e., opaque white) thermoplastic material or of a sufficiently thin sheet metal, it is possible for the entire laminated card to be embossed, as discussed above, like conventional credit cards. Such features as the present invention offers would lead to the substantial lessening, if not the elimination, of the purchase of consumer goods on stolen credit cards.

Having thus described my invention, I claim:

1. A process, utilizing the following raw materials (a) backing means having a heat-sealable surface, (b) a bonding material that is photosensitive and becomes harder upon exposure to light, and (c) a transparent heat-sealable cover, said surface, said bonding material and said cover being compatible in that they may be merged and caused to flow together to form one integral construction when adequate heat and pressure are applied to them, for producing identification cards, comprising: applying said bonding material to said surface of said backing means in a configuration that conforms to the picture to be included as a part of the identification card, the process including applying particulate material to the bonding material, placing the transparent heat-sealable cover over the bonding material and said surface, and applying heat and pressure to cause the materials comprising said surface, said bonding material and said coating to flow together to form an integral identification card with improved alter-proof characteristics.

2. The process of claim 14 wherein said particulate material includes mildly radioactive isotopes and/or radioactive rare earth metals or compounds thereof.

3. The process of claim 1 wherein said particulate material includes rare earth materials and/or phosphors emitting infrared light waves.

4. The process of claim 1 wherein said particulate material includes promethium-147, thorium or thorium oxide.

5. The process of claim 1 wherein said backing means is made by the steps of providing a cobalt-vanadium-iron alloy magnetic material, coating the alloy with a metallic substance, chemically treating the coated alloy and then coating with an opaque thermoplastic material.

6. The process of claim 5 which comprises electroplating the cobalt-vanadium-iron alloy with iron, then etching with a strong alkaline solution containing sodium carbonate, and then treating with a solution of iron phosphate, and heating to deposit the iron phosphate on the iron that was electroplated onto said alloy.

7. The process of claim 1 in which the step of applying heat and pressure comprises laminating the card between flat platens at a pressure of about 750–1000 psi by heating to about 325° F to 350° F and then quenching to room temperature while still under pressure.

8. A process, utilizing the following raw materials (a) a backing having a heat-sealable surface, (b) a material that is tacky and is photosensitive and becomes harder and non-tacky upon exposure to light, and (c) a transparent heat-sealable cover, said surface, said material and said cover being compatible in that they may be merged and caused to flow together to form one integral construction when adequate heat and pressure are applied to them, for producing an identification card which comprises spreading said material on a substrate to form a coated substrate, placing a transparent protective film over the coated substrate, superposing on the transparent protective film a half-tone photograph having an opaque portion and a transparent portion, exposing said coated substrate to light rays by directing light rays through the photograph to render non-tacky the portions of said material which correspond to those parts of the photograph that are transparent, removing the photograph and the protective film from said coated substrate, spreading particulate material over said first-named material so that the particles stick to the tacky portion of the first-named material, removing the particulate material that did not adhere, placing said coated substrate in contact with said surface of said backing in such a manner so that said first-named material is directly contacting the backing and transfers said tacky portion of the first-named material and the particulate material on said tacky portion to the backing, and removing the coated substrate from said backing whereby the tacky portion of said first-named material remains adhered to said backing, placing said transparent heat-sealable cover over said surface including any of said materials that have adhered to said surface, and applying heat and pressure to the surface, the materials and the transparent cover, to merge them together causing said first-named material to merge into said surface and causing the transparent cover to merge into said surface including such merger in the spaces between half-tone dots, thus to form an identification card in which the backing, the first-named material and said cover have become integral thus improving the alter-proof characteristics of the card.

9. The process of claim 8 wherein the said particulate material includes promethium-147, thorium or thorium oxide.

10. The process of claim 8 wherein said particulate material includes mildly radioactive isotopes and/or radioactive rare earth metals or compounds thereof.

11. The process of claim 8 wherein said particulate material includes rare earth materials and/or phosphors emitting infrared light waves.

12. The process of claim 8 wherein said backing is cobalt-iron alloy magnetic material which is obtained by electroplating the cobalt-iron alloy with a metallic substance, chemically treating the plated alloy and then coating with an opaque thermoplastic material.

13. The process of claim 8 in which the backing is a cobalt-iron alloy, comprising electroplating the cobalt-iron alloy with iron, then etching with a phosphoric acid solution or a strong alkaline solution containing sodium carbonate and then treating with a bath of iron phosphate.

14. The process of claim 8 in which the step of applying heat pressure comprises pressing the card between flat plates at a pressure of about 750-1000 psi, heating to about 325° F to 350° F and then quenching with a cold liquid to room temperature while still under pressure.

15. The process of claim 8 wherein said backing is obtained by coating a steel containing 38% by weight of iron, 10% by weight of vanadium, and 52% by weight of cobalt with a vinyl polymer.

16. A process for producing an identification card which comprises spreading bonding material that is hardened by light on a substrate, placing a transparent protective film over the coated substrate, superposing on the transparent protective film a half-tone photograph having an opaque portion and a transparent portion, exposing said coated substrate to light rays by directing light rays through the photograph to harden the portions of the bonding material which correspond to those parts of the photograph that are transparent, removing the photographic image and the protective film from said coated substrate, spreading particulate material over said bonding material so that the particles stick to the unhardened portion of the bonding material, removing the particulate material that has not adhered, and thereby obtaining the photographic image, providing a backing and a transparent cover which are compatible with each other and with said bonding material in the sense that they merge together under heat and pressure, placing said coated substrate with said image thereon in contact with a backing in such a manner so that the image is directly contacting the backing, removing the coated substrate from said backing whereby the image remains adhered to the backing, and sealing a transparent covering to the backing by heat and pressure to join the backing and the covering not only between the dots of particulate material but outside the boundary of the picture formed on the backing.

17. The process of claim 11 wherein said backing means comprises a steel sheet with a thermoplastic coating to on at least one surface thereof and wherein the coated substrate with the image thereon and backing means are contacted under pressure and a temperature of between about 225° F to 240° F and then contacted again under increased pressure at a higher temperature of between about 275° F to 300° F to cause the image to fuse into the coating on the backing means.

18. The process of claim 17 wherein said steel sheet is cobalt-iron alloy magnetic material electro-plated with a metallic substance and chemically treated.

19. The process of claim 17 wherein said backing means comprises a steel sheet containing 38% by weight of iron, 10% by weight of vanadium and 52% by weight of cobalt with a thermoplastic vinyl polymer coating on at least one surface thereof.

20. The identification card of claim 16 wherein said particles include mildly radioactive isotopes and/or radioactive rare earth metals or compounds thereof.

21. The process of claim 16 wherein said particulate material includes rare earth materials and/or phosphors emitting infrared light waves.

22. The process of claim 17 wherein said steel sheet is cobalt-iron alloy magnetic material containing about 36 to 62% by weight of cobalt, about 30 to 52% by weight of iron, and up to about 16% by weight of a metal selected from the group consisting of vanadium, nickel, carbon, silicon, molybdenum, praseodymium, samarium, lanthanum, cerium, mischmetal and mixtures thereof.

23. The process of claim 17 wherein said steel sheet is cobalt-iron alloy containing about 36 to 62% by weight of cobalt, about 30 to 52% by weight of iron and about 6 to 16% by weight of a mixture of a member selected from the group consisting of vanadium, nickel, molybdenum and mixtures thereof, and a member selected from the group consisting of praseodymium, samarium, lanthananum, cerium, mischmetal and mixtures thereof.

24. The process of claim 17 wherein said steel sheet is cobalt-iron alloy magnetic material containing about 55 to 60% cobalt, about 25 to 30% iron, about 5 to 8% praseodymium, samarium, lanthanum, cerium or mischmetal, and about 10 to 15% vanadium.

25. The process of claim 17 wherein said particulate material includes promethium-147, thorium or thorium oxide.

26. The process of claim 17 wherein said backing means is cobalt-iron alloy magnetic material which is obtained by electro-plating the cobalt-iron alloy with a metallic substance, chemically treating the plated alloy and then coating with an opaque thermoplastic material.

27. The process of claim 17 which comprises electroplating the cobalt-iron alloy with iron, then etching with a phosphoric acid solution or a strong alkaline solution containing sodium carbonate.

28. The process of claim 17 which comprises laminating the card between flat-platens at a pressure of about 750-1000 psi by heating to about 325° F to 350° F and then quenching to room temperature under high pressure with a zero degree liquid while still under pressure.

29. The process of claim 17 wherein said particulate material includes mildly radioactive isotopes and/or radioactive rare earth metals or compounds thereof.

30. The process of claim 17 wherein said particulate material includes rare earth materials and/or phosphors emitting infrared light waves.

31. The process of claim 17 wherein said backing means is obtained by coating a steel containing 38% by weight of iron, 10% by weight of vanadium, and 52% by weight of cobalt with a vinyl polymer.

32. The identification card of claim 17 wherein said sheet steel is a cobalt alloy containing 50 to 60% by weight of cobalt, 10 to 12% by weight of rare earth metals praseodymium, samarium, lanthanum, mischmetal or cerium, 20 to 30% by weight of iron and 8 to 10% by weight of vanadium.

33. The process claim 1 wherein said backing means is a cobalt alloy containing 50 to 60% by weight of cobalt, 10 to 12% by weight of rare earth metals praseodymium, samarium, lanthanum, mischmetal or cerium, 20 to 30% by weight of iron and 8 to 10% by weight of vanadium.

34. The process claim 8 wherein said backing means is a cobalt alloy containing 50 to 60% by weight of cobalt, 10 to 12% by weight of rare earth metals praseodymium, samarium, lanthanum, mischmetal or cerium, 20 to 30% by weight of iron and 8 to 10% by weight of vanadium.

35. The process claim 16 wherein said backing means is a cobalt alloy containing 50 to 60% by weight of cobalt, 10 to 12% by weight of rare earth metals praseodymium, samarium, lanthanum, mischmetal or cerium, 20 to 30% by weight of iron and 8 to 10% by weight of vanadium.

36. The process claim 17 wherein said backing means is a cobalt alloy containing 50 to 60% by weight of cobalt, 10 to 12% by weight of rare earth metals praseodymium, samarium, lanthanum, mischmetal or cerium, 20 to 30% by weight of iron and 8 to 10% by weight of vanadium.

37. The method of making an identification card comprising
providing a sheet of thermoplastic material,
providing a sheet of magnetizable material having a hexagonal crystaline molecular structure which can be magnetically coded at selected locations in accordance with a predetermined identification code,
providing a metal that may be coated upon said magnetizable material and which will firmly adhere thereto and has characteristics that permit said sheet of thermoplastic material to be sealed to a coating composed of such metal,
coating said metal on said magnetizable material to effect a firm adherence of the metal to the magnetizable material,
applying tacky material to the coating and a pigment held by the tacky material, to form a picture on the coating, and
applying heat and pressure to seal said thermoplastic sheet to said coating.

38. The method of claim 37 in which said metal is iron.

39. The method of claim 37 in which said coating step comprises electroplating the metal on the magnetic material.

40. The method of claim 37 in which prior to the coating step some of one surface of the sheet of magnetizable material is electrolytically removed, said coating step comprising electroplating said metal on said surface.

41. The method of claim 37 in which an iron electrode is provided comprising:
removing, prior to said coating step, some of one surface of said sheet of magnetic material, by a process step comprising applying an electric potential between the magnetizable material and the electrode, to thus prepare said surface to receive an iron coating, and
reversing the polarity between the electrode and the magnetizable material to electroplate an iron coating on said magnetizable material.

* * * * *

UNITED STATES PATENT OFFICE
CERTIFICATE OF CORRECTION

Patent No. 4,097,279      Dated  June 27, 1978

Inventor(s)   Edwin Nelson Whitehead

It is certified that error appears in the above-identified patent and that said Letters Patent are hereby corrected as shown below:

In claim 2, line 1, change "14" to "1".

Signed and Sealed this

Twenty-second Day of May 1979

[SEAL]

Attest:

RUTH C. MASON
Attesting Officer

DONALD W. BANNER
Commissioner of Patents and Trademarks